US012765209B2

(12) United States Patent
Lou et al.

(10) Patent No.: US 12,765,209 B2
(45) Date of Patent: Oct. 13, 2026

(54) DISPLAY PANEL WITH TRANSITION DISPLAY REGION AND PIXEL CIRCUIT DISTRIBUTION DENSITY CONTROL

(71) Applicant: Hefei Visionox Technology Co., Ltd., Hefei (CN)

(72) Inventors: Junhui Lou, Hefei (CN); Yanqin Song, Hefei (CN); Lu Zhang, Hefei (CN)

(73) Assignee: Hefei Visionox Technology Co., Ltd., Hefei (CN)

(*) Notice: Subject to any disclaimer, the term of this patent is extended or adjusted under 35 U.S.C. 154(b) by 622 days.

(21) Appl. No.: 18/340,236

(22) Filed: Jun. 23, 2023

(65) Prior Publication Data

US 2023/0345790 A1 Oct. 26, 2023
US 2024/0130191 A9 Apr. 18, 2024

Related U.S. Application Data

(63) Continuation of application No. PCT/CN2021/134754, filed on Dec. 1, 2021.

(30) Foreign Application Priority Data

Apr. 20, 2021 (CN) ......................... 202110426897.4

(51) Int. Cl.
*H10K 59/12* (2023.01)
*H10K 59/121* (2023.01)
(Continued)

(52) U.S. Cl.
CPC ....... *H10K 59/353* (2023.02); *H10K 59/1213* (2023.02); *H10K 59/1216* (2023.02); *H10K 59/122* (2023.02); *H10K 59/131* (2023.02)

(58) Field of Classification Search
CPC .. H01K 59/353; H10K 59/131; H10K 59/122; H10K 59/1213; H10K 59/1216
(Continued)

(56) References Cited

FOREIGN PATENT DOCUMENTS

| | | |
|---|---|---|
| CN | 109285860 A | 1/2019 |
| CN | 110783384 A | 2/2020 |

(Continued)

OTHER PUBLICATIONS

Office Action issued on Sep. 15, 2022, in corresponding Chinese Application No. 202110426897.4, 6 pages.

(Continued)

*Primary Examiner* — Phuc T Dang
(74) *Attorney, Agent, or Firm* — Maier & Maier, PLLC

(57) ABSTRACT

A display panel including: a first pixel group located in a first display region and including first light-emitting sub-pixels; a plurality of second sub-pixels located in a second display region; a third pixel group located in a transition display region and including a plurality of third light-emitting sub-pixels; a plurality of first pixel circuits located in the transition display region, the first pixel circuits are electrically connected to the first light-emitting sub-pixels for driving the first light-emitting sub-pixels to display; a plurality of second pixel circuits located in the second display region, the second pixel circuits are electrically connected to the second sub-pixels for driving the second sub-pixels to display; and a plurality of third pixel circuits located in the transition display region, the third pixel circuits are electrically connected to the third light-emitting sub-pixels for driving the third light-emitting sub-pixels to display.

19 Claims, 5 Drawing Sheets

(51) Int. Cl.

| | |
|---|---|
| ***H10K 59/122*** | (2023.01) |
| ***H10K 59/131*** | (2023.01) |
| ***H10K 59/35*** | (2023.01) |

(58) Field of Classification Search

USPC .............................................................. 257/40

See application file for complete search history.

(56) References Cited

FOREIGN PATENT DOCUMENTS

| | | | | | |
|---|---|---|---|---|---|
| CN | 110783386 A | * | 2/2020 | ........... H10K 59/131 |
| CN | 110914891 A | | 3/2020 | |
| CN | 111192902 A | | 5/2020 | |
| CN | 111445847 A | * | 7/2020 | ........... G09G 3/3208 |
| CN | 111969027 A | * | 11/2020 | ........... G09G 3/3225 |
| CN | 110767712 B | | 1/2021 | |
| CN | 107610636 B | | 2/2021 | |
| CN | 113140609 A | * | 7/2021 | ............. H10K 50/86 |
| JP | 2014235853 A | | 12/2014 | |
| WO | WO-2020238343 A1 | * | 12/2020 | ............. H10D 86/60 |

OTHER PUBLICATIONS

Office Action issued on Jul. 12, 2022, in corresponding Chinese Application No. 202110426897.4, 12 pages.

International Search Report mailed on Mar. 15, 2022, in corresponding International Application No. PCT/CN2021/134754, 5 pages.

* cited by examiner

DISPLAY PANEL WITH TRANSITION DISPLAY REGION AND PIXEL CIRCUIT DISTRIBUTION DENSITY CONTROL

CROSS-REFERENCE TO RELATED APPLICATIONS

This application is a continuation of International Application No. PCT/CN2021/134754, filed on Dec. 1, 2021, which claims priority to Chinese Patent Application No. 202110426897.4 filed on Apr. 20, 2021, and entitled "DISPLAY PANEL AND DISPLAY APPARATUS", both of which are hereby incorporated by reference in their entireties.

TECHNICAL FIELD

The present application relates to the field of display technology, and in particularly, to a display panel.

BACKGROUND

With rapid development of electronic devices and user requirements for higher screen-to-body ratio, full-screen displays of electronic devices are getting more and more attention of the industry.

Conventional electronic devices such as mobile phones and tablet computers are required to integrate elements such as front cameras, earphones and infrared sensing elements. In the prior art, by forming a notch or an opening on a display screen, external light may enter photosensitive elements located under the screen through the notch or the opening on the display screen. However, these electronic devices do not have a true full-screen display and cannot display images on various regions of the entire screen. For example, images cannot be displayed on the region corresponding to the front camera.

SUMMARY

Embodiments of the present application provide a display panel.

In a first aspect, the embodiments of the present application provide a display panel including a first display region, a second display region and a transition display region located between the first display region and the second display region, wherein a light transmittance of the first display region is greater than a light transmittance of the second display region, and the display panel includes: a first pixel group located in the first display region and including first light-emitting sub-pixels; a plurality of second sub-pixels located in the second display region; a third pixel group located in the transition display region and including a plurality of third light-emitting sub-pixels; a plurality of first pixel circuits located in the transition display region, wherein the first pixel circuits are electrically connected to the first light-emitting sub-pixels for driving the first light-emitting sub-pixels to display; a plurality of second pixel circuits located in the second display region, wherein the second pixel circuits are electrically connected to the second sub-pixels for driving the second sub-pixels to display; a plurality of third pixel circuits located in the transition display region, wherein the third pixel circuits are electrically connected to the third light-emitting sub-pixels for driving the third light-emitting sub-pixels to display, and distribution densities of the first pixel circuits and the third pixel circuits in the transition display region and a distribution density of the second pixel circuits in the second display region satisfy a relationship in a formula 1, $$\frac{|(P_{10}+P_{30})-P_{20}|}{P_{20}} \leq 5\% \qquad \text{formula 1}$$

wherein $P_{10}$ is the distribution density of the first pixel circuits in the transition display region, $P_{30}$ is the distribution density of the third pixel circuits in the transition display region, and $P_{20}$ is the distribution density of the second pixel circuits in the second display region.

DETAILED DESCRIPTION

Features and exemplary embodiments of various aspects of the present application will be described in detail below. To make the objects, technical solutions and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application may be implemented without some of these specific details. The following description of the embodiments is merely to provide a better understanding of the present application by illustrating the examples of the present application.

In recent years, a full screen display has become the mainstream design in the display field and has been favored by consumers. However, the presence of front cameras, infrared light sensors, and the like has been a difficulty in the development of full screen display technology, and the introduction of the under-screen camera technology has brought the possibility for the full screen display.

The under-screen camera means that the front camera or the like is arranged under the screen, and a display region above the camera is designed as a light-transmitting display region. In order to improve the transparency of the first display region, the pixel driving circuits in the first display region are required to be removed from the light-transmitting display region, so that there is a transition region between the light-transmitting display region and the normal display region, and the transition region is obviously visible after the display screen is switched off, thereby affecting the appearance of the device.

For a better understanding of the present application, a display panel and a display apparatus according to the embodiments of the present application will be described in detail with reference to FIG. 1 to FIG. 9.

The embodiments of the present application provide a display panel which may be a display panel of organic light emitting diode (OLED).

Figure 1:
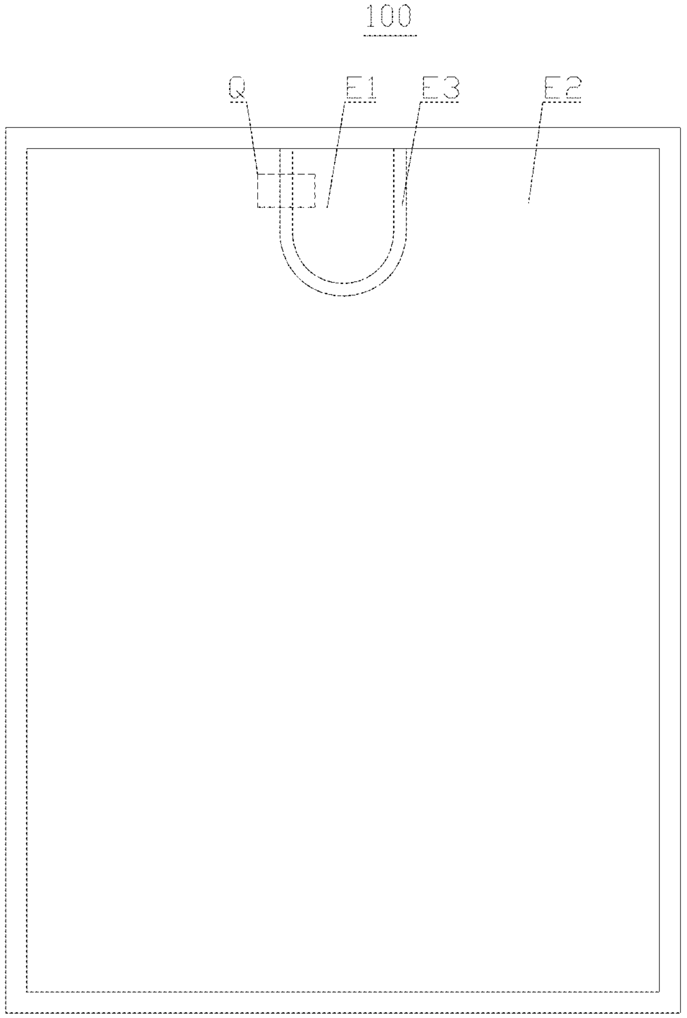
FIG. 1 is a schematic structural view of a display panel according to an embodiment of the present application.
Figure 2:
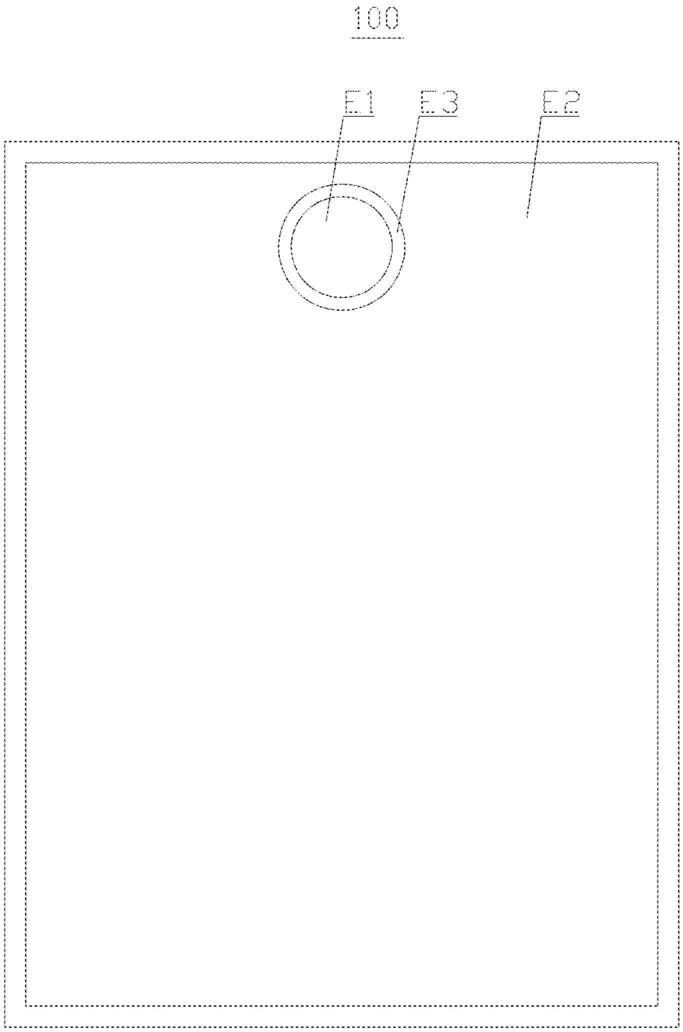
FIG. 2 is a schematic structural view of a display panel according to another embodiment of the present application.
Figure 3:
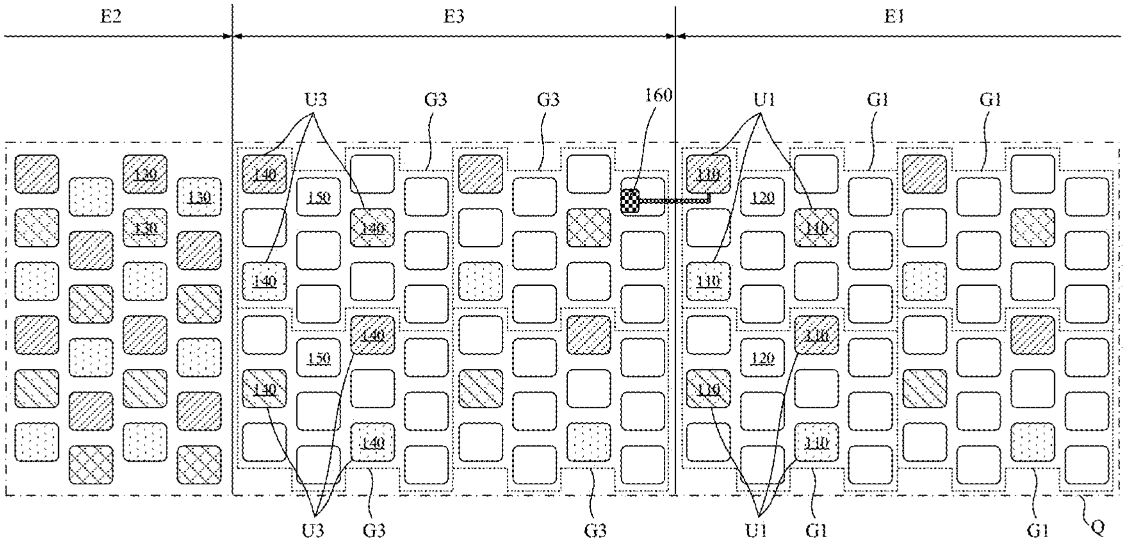
FIG. 3 is an enlarged view of an example structure of a region Q in FIG. 1.
Figure 4:
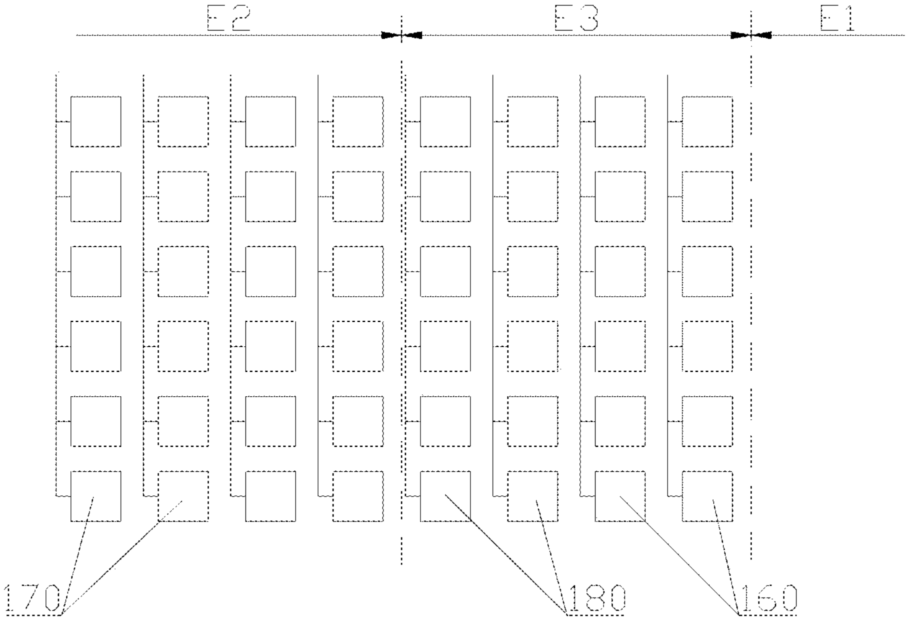
FIG. 4 is another enlarged view of an example structure of a region Q in FIG. 1.

FIG. 1 is a schematic structural view of a display panel according to an embodiment of the present application; FIG. 2 is a schematic structural view of a display panel according to another embodiment of the present application; FIG. 3 is an enlarged view of an example structure of a region Q in FIG. 1; FIG. 4 is another enlarged view of an example structure of a region Q in FIG. 1.

As shown in FIG. 1 and FIG. 2, a display panel 100 has a first display region E1, a second display region E2 and a transition display region E3 located between the first display region E1 and the second display region E2, a light transmittance of the first display region E1 is greater than a light transmittance of the second display region E2.

Herein, the light transmittance of the first display region E1 preferred to be greater than or equal to 15%. In order to ensure that the light transmittance of the first display region E1 is greater than 15%, or greater than 40%, or even greater, a corresponding light-transmittance of each functional film layer of the display panel 100 in the embodiment is greater than 80%, and light-transmittances of at least a part of the functional film layers are even greater than 90%.

In the display panel 100 according to the embodiment of the present application, the light transmittance of the first display region E1 is greater than the light transmittance of the second display region E2, so that a photosensitive component may be integrated on a backside of the first display region E1 of the display panel 100, achieving the under-screen integration of a photosensitive component such as a camera, and meanwhile, the first display region E1 can display an image, so that a display area of the display panel 100 increases, thereby achieving a full-screen design of the display apparatus.

In the embodiment shown in FIG. 1, an example is given in which "the transition display region E3 is U-shaped and partially surrounds the first display region E1". In the embodiment shown in FIG. 2, the first display region E1 may be a circle, the transition display region E3 surrounds the first display region E1, and the second display region E2 surrounds the transition display region E3. In other embodiments, the first display region E1 may be other shapes, and a position of the first display region E1 may be adjusted. For example, in other embodiments, the display panel 100 may be adjusted to be other shapes.

As shown in FIG. 3, the display panel 100 includes a first pixel group G1 located in the first display region E1, a plurality of second sub-pixels 130 located in the second display region E2, and a third pixel group G3 located in the transition display region E3. The first pixel group G1 may include a first light-emitting pixel unit U1 including first light-emitting sub-pixels 110, and the third pixel group G3 may include a third light-emitting pixel unit U3 including third light-emitting sub-pixels 140. The first light-emitting sub-pixels 110 and the third light-emitting sub-pixels 140 can emit light and display.

In some optional embodiments, the first light-emitting sub-pixels 110, the second sub-pixels 130, and the third light-emitting sub-pixels 140 each have a plurality of different colors. In FIG. 3, different patterns are used to distinguish sub-pixels of different colors from each other, wherein sub-pixels of a same color are drawn by using a same fill pattern.

The first light-emitting sub-pixels 110 may include a red first light-emitting sub-pixel 110, a green first light-emitting sub-pixel 110 and a blue first light-emitting sub-pixel 110, and optionally, each first light-emitting pixel unit U1 may include one red first light-emitting sub-pixel 110, one green first light-emitting sub-pixel 110 and one blue first light-emitting sub-pixel 110.

The third light-emitting sub-pixels 140 may include a red third light-emitting sub-pixel 140, a green third light-emitting sub-pixel 140 and a blue third light-emitting sub-pixel 140, and optionally, each third light-emitting pixel unit U3 includes one red third light-emitting sub-pixel 140, one green third light-emitting sub-pixel 140 and one blue third light-emitting sub-pixel 140.

Similarly, in the second display region E2, the display panel 100 may include a second pixel unit including second sub-pixels 130. Each second pixel unit may include one red second sub-pixel 130, one green second sub-pixel 130, and one blue second sub-pixel 130.

In the embodiments of the present application, a number of sub-pixels and types of colors included in each of the first light-emitting pixel unit U1, the third light-emitting pixel unit U3 or the second pixel unit may be adjusted according to designing requirements of the display panel 100.

As shown in FIG. 3 and FIG. 4, the display panel 100 further includes a plurality of first pixel circuits 160 and a plurality of third pixel circuits 180 located in the transition display region E3 and a plurality of second pixel circuits 170 located in the second display region E2. The first pixel circuits 160 are electrically connected to the first light-emitting sub-pixels 110 for driving the first light-emitting sub-pixels 110 to display; the second pixel circuits 170 are electrically connected to the second sub-pixels 130 for driving the second sub-pixels 130 to display; the third pixel circuits 180 are electrically connected to the third light-emitting sub-pixels 140 for driving the third light-emitting sub-pixels 140 to display.

In the display panel 100 according to the embodiments of the present application, the first pixel circuits 160 configured for driving the first light-emitting sub-pixels 110 to display are arranged in the transition display region E3, so that a wiring structure in the first display region E1 can be reduced, thereby improving the light transmittance of the first display region E1.

In some optional embodiments, distribution densities of the first pixel circuits 160 and the third pixel circuits 180 in the transition display region E3 and a distribution density of the second pixel circuits 170 in the second display region E2 may satisfy a relationship in a formula 1 below, $$\frac{|(P_{10}+P_{30})-P_{20}|}{P_{20}} \leq 5\% \qquad \text{formula 1}$$

wherein $P_{10}$ is the distribution density of the first pixel circuits 160 in the transition display region E3, $P_{30}$ is the distribution density of the third pixel circuits 180 in the transition display region E3, and $P_{20}$ is the distribution density of the second pixel circuits E2 in the second display region E2.

Optionally, a sum of the distribution densities of the first pixel circuits 160 and the third pixel circuits 180 in the transition display region E3 is equal to the distribution density of the second pixel circuits 170 in the second display region, that is $P_{10}+P_{30}=P_{20}$.

Herein, "the sum of the distribution densities of the first pixel circuits 160 and the third pixel circuits 180 in the transition display region E3" means a sum of "the distribution density of the first pixel circuits 160 in the transition display region E3" and "the distribution density of the third pixel circuits 180 in the transition display region E3".

In the display panel 100 according to the embodiments of the present application, the difference between the distribution densities of the first pixel circuits 160 and the third pixel circuits 180 in the transition display region E3 and the distribution density of the second pixel circuits 170 in the second display region E2 is set to be small or even the distribution densities of the first pixel circuits 160 and the third pixel circuits 180 in the transition display region are set to be the same as the distribution density of the second pixel circuits 170 in the second display region E2, so that the transition display region E3 and the second display region E2 have similar driving device layer structures. Therefore, a reflectivity difference between the transition display region E3 and the second display region E2 can be reduced, so that there is a relative small appearance difference between the transition display region E3 and the second display region E2 of the display panel 100 when the screen is switched off, thereby improving a viewing effect of the display panel 100 when the screen is switched off.

In the embodiments of the present application, a circuit structure of the first pixel circuit 160, a circuit structure of the second pixel circuit 170 and a circuit structure of the third pixel circuit 180 are any one of a 2T1C circuit including two transistors and one capacitor, a 7T1C circuit including seven transistors and one capacitor, a 7T2C circuit including seven transistors and two capacitors or a 9T1C circuit including nine transistors and one capacitor respectively. Herein, the "circuit 2T1C" refers to a pixel circuit including two thin film transistors (T) and one capacitor (C) in the pixel circuit, and the structures of other circuits including the "circuit 7T1C", the "circuit 7T2C", the "circuit 9T1C" and the like are similar.

In some optional embodiments, the first pixel circuits 160 and the third pixel circuits 180 in the transition display region E3 may have a same arrangement as the second pixel circuits 170 in the second display region E2, so that a circuit arrangement structure jointly formed by the first pixel circuits 160 and the third pixel circuits 180 is same as a circuit arrangement structure formed by the second pixel circuits 170, thereby further reducing the reflectivity difference between the transition display region E3 and the second display region E2.

Optionally, the second pixel circuits 170 may be distributed in an array and arranged uniformly in the second display region E2, and the first pixel circuits 160 and the third pixel circuits 180 are distributed in an array and arranged uniformly in the transition display region E3, so that a boundary between the transition display region E3 and the second display region E2 is blurred, thereby avoiding occurrence of an obvious boundary between the two display regions when the screen is switched off.

In some optional embodiments, the third pixel group G3 further includes third non-light-emitting sub-pixels 150 which do not emit light. Since the third pixel group G3 includes both the third light-emitting sub-pixels 140 which can emit light and display and the third non-light-emitting sub-pixels 150 which cannot emit light and display, an actual pixel density of the transition display region E3 can be reduced, so as to have a sufficient place to arrange the first pixel circuits 160, thereby making the layout of the pixel circuits more appropriate.

Optionally, distribution densities of the third light-emitting sub-pixels 140 and the third non-light-emitting sub-pixels 150 in the transition display region E3 and a distribution density of the second sub-pixels 130 in the second display region E2 may satisfy a relationship in a formula 2 below, $$\frac{|(P_{31}+P_{32})-P_{21}|}{P_{21}} \leq 5\% \qquad \text{formula 2}$$

wherein which $P_{31}$ is the distribution density of the third light-emitting sub-pixels 140 in the transition display region E3, $P_{32}$ is the distribution density of the third non-light-emitting sub-pixels 150 in the transition display region E3, and $P_{21}$ is the distribution density of the second sub-pixels 130 in the second display region E2.

Optionally, the distribution densities of the third light-emitting sub-pixels 140 and the third non-light-emitting sub-pixels 150 in the transition display region E3 are equal to the distribution density of the second sub-pixels 130 in the second display region E2, that is, $P_{31}+P_{32}=P_{21}$.

Herein, "the distribution densities of the third light-emitting sub-pixels 140 and the third non-light-emitting sub-pixels 150 in the transition display region E3" means a sum of the "the distribution density of the third light-emitting sub-pixels 140 in the transition display region E3" and "the distribution density of the third non-light-emitting sub-pixels 150 in the transition display region E3".

In the display panel 100 according to the embodiments of the present application, the difference between the distribution densities of the third light-emitting sub-pixels 140 and the third non-light-emitting sub-pixels 150 in the transition display region E3 and the distribution density of the second sub-pixels 130 in the second region E2 is set to be small or even the distribution densities of the third light-emitting sub-pixels 140 and the third non-light-emitting sub-pixels 150 in the transition display region E3 are set to be the same as the distribution density of the second sub-pixels 130 in the second region E2, so that the transition display region E3 and the second display region E2 have similar driving device layer structures. Therefore, the reflectivity difference between the transition display region E3 and the second display region E2 can be further reduced, thereby improving the viewing effect of the display panel 100 when the screen is switched off.

In some optional embodiments, the third light-emitting sub-pixels 140 and the third non-light-emitting sub-pixels 150 in the transition display region E3 may have a same arrangement as the second sub-pixels 130 in the second display region E2, so that a pixel arrangement structure jointly formed by the third light-emitting sub-pixels 140 and the third non-light-emitting sub-pixels 150 is same as a pixel arrangement structure formed by the second sub-pixels 130, thereby facilitating manufacturing of the display panel 100 and further reducing the reflectivity difference between the transition display region E3 and the second display region E2.

Optionally, the second sub-pixels 130 may be arranged uniformly in the second display region E2, and the third light-emitting sub-pixels 140 and the third non-light-emitting sub-pixels 150 are arranged uniformly in the transition display region E3, so that a boundary between the transition display region E3 and the second display region E2 is blurred, thereby avoiding occurrence of an obvious boundary between the two display regions when the screen is switched off.

Optionally, the third light-emitting sub-pixel 140 and the second sub-pixel 130 of a same color may have a nearly same size, so as to further reduce a structural difference between the transition display region E3 and the second display region E2. As an example, the third light-emitting sub-pixel 140 and the second sub-pixel 130 of the same color may have the same size, thereby facilitating the manufacturing of the display panel 100. Of course, in some other embodiments, a size of the third light-emitting sub-pixel 140 may be less than a size of the second sub-pixel 130 of the same color, which is also within the protection scope of the present application.

In the display panel 100 according to the embodiments of the present application, in order to improve the light transmittance of the first display region E1, the first pixel circuits 160 configured for driving the first light-emitting sub-pixels 110 to display are arranged in the transition display region E3; and in order to avoid the first pixel circuits 160 occupying too much space in the transition display region E3, an actual pixel density of the first display region E1 may be reduced, so that the actual pixel density of the first display region E1 is less than the pixel density of the second display region E2, that is, the distribution density of the first light-emitting sub-pixels 110 in the first display region E1 may be less than the distribution density of the second sub-pixels 130 in the second display region E2, so as to reduce a number of the first pixel circuits 160.

Optionally, the first pixel group G1 further includes first non-light-emitting sub-pixels 120 which do not emit light. Since the first pixel group G1 includes both the first light-emitting sub-pixels 110 which can emit light and display and the first non-light-emitting sub-pixels 120 which do not emit light and display, an actual pixel density of the first display region E1 can be reduced; in addition, since only the first light-emitting sub-pixels 110 are required to be connected to driving signal lines, a number of the driving signal lines arranged in the first display region E1 is reduced, thereby improving the light transmittance of the first display region E1.

Of course, the distribution density of the first light-emitting sub-pixels 110 in the first display region E1 may be set to be same as the distribution density of the second sub-pixels 130 in the second display region E2; under this condition, the light transmittance of the first display region E1 may be improved by reducing the size of the first light-emitting sub-pixel 110, and meanwhile, a number of the first pixel circuits 160 may be reduced by driving a plurality of first light-emitting sub-pixels 110 to display by one first pixel circuit 160, which is also within the protection scope of the present application.

In some optional embodiments, the distribution density of the third light-emitting sub-pixels 140 in the transition display region E3 and the distribution density of the first light-emitting sub-pixels 110 in the first display region E1 may satisfy a relationship in a formula 3, $$\frac{|P_{31} - P_{11}|}{P_{11}} \leq 5\% \qquad \text{formula 3}$$

wherein $P_{31}$ is the distribution density of the third light-emitting sub-pixels 140 in the transition display region E3, and $P_{11}$ is the distribution density of the first light-emitting sub-pixels 110 in the first display region E1.

As an example, the distribution density of the third light-emitting sub-pixels 140 in the transition display region E3 may be set to be equal to the distribution density of the first light-emitting sub-pixels 110 in the first display region E1, that is, $P_{31}=P_{11}$.

A difference between the distribution density of the third light-emitting sub-pixels 140 in the transition display region E3 and the distribution density of the first light-emitting sub-pixels 110 in the first display region E1 is reduced, so that a display difference between the transition display region E3 and the first display region E1 is reduced when the display panel displays an image, thereby improving the display effect.

Optionally, an arrangement of the third light-emitting sub-pixels 140 in the transition display region E3 is same as an arrangement of the first light-emitting sub-pixels 110 in the first display region E1, so that a pixel arrangement structure formed by the third light-emitting sub-pixels 140 is same as a pixel arrangement structure formed by the first light-emitting sub-pixels 110, and thus occurrence of an obvious boundary between the transition display region E3 and the first display region E1 can be avoided when the display panel 100 displays an image, thereby further improving the display effect.

Optionally, the third light-emitting sub-pixel 140 and the first light-emitting sub-pixel 110 of a same color have a nearly same size to facilitate the manufacturing of the display panel 100 and ensure that a display uniformity of the transition display region E3 and the second display region E2. Of course, a size of the third light-emitting sub-pixel 140 is not limited thereto, for example, a size of the third light-emitting sub-pixel 140 may be greater than a size of the first sub-pixel of the same color, which is also within the protection scope of the present application.

Figure 5:
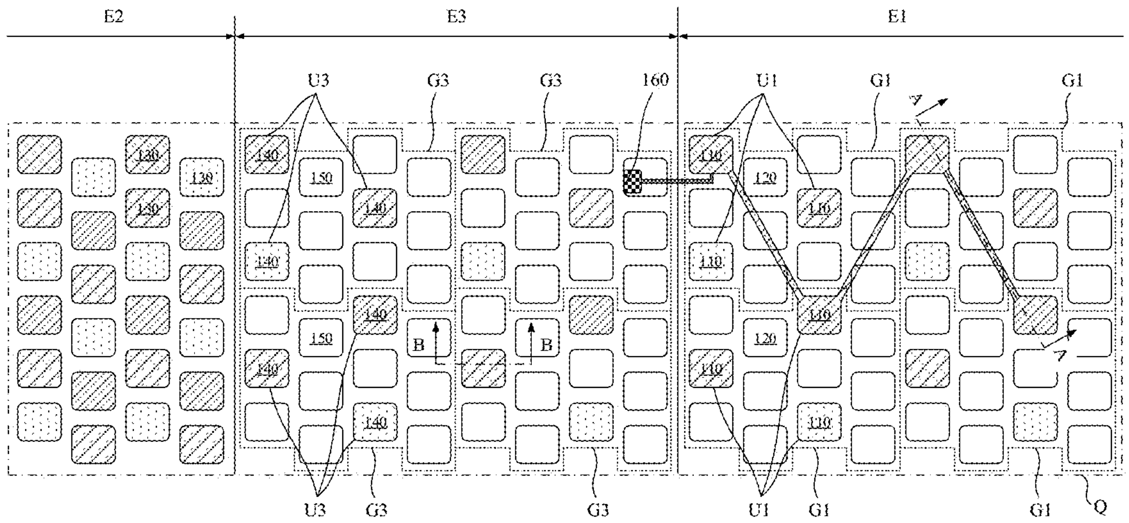
FIG. 5 is an enlarged view of another example structure of a region Q in FIG. 1.
Figure 6:
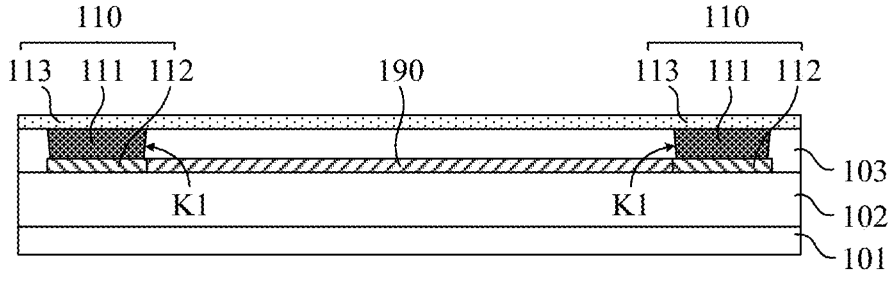
FIG. 6 shows a cross-sectional view along A-A in FIG. 5.
Figure 7:
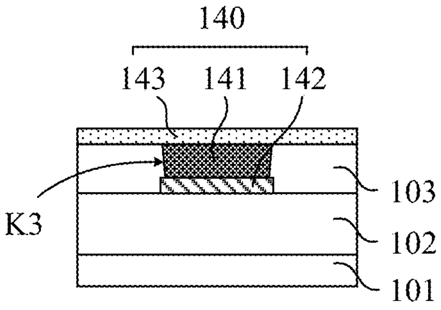
FIG. 7 shows a cross-sectional view along B-B in FIG. 5.

FIG. 5 is an enlarged view of another example of a region Q in FIG. 1; FIG. 6 shows a cross-sectional view along A-A in FIG. 5; FIG. 7 shows a cross-sectional view along B-B in FIG. 5. A part of the structure of the embodiments related to FIG. 5, FIG. 6 and FIG. 7 is same as a part of the structure of the embodiment related to FIG. 4, which will not be described in detail, and differences between the two will be described below.

As shown in FIG. 5 to FIG. 7, in some optional embodiments, the display panel 100 includes a substrate 101, a driving device layer 102 and a light-emitting device layer 103. The driving device layer 102 is located on the substrate 101, and the first pixel circuits 160, the second pixel circuits 170 and the third pixel circuits 180 are located in the driving device layer 102. The light-emitting device layer 103 is located at a side of the driving device layer 102 away from the substrate 101, and the first pixel group G1, the second sub-pixels 130 and the third pixel group G3 are located in the light-emitting device layer 103.

Optionally, the substrate 101 may be made of light-transmitting materials such as glass, polyimide (PI), and the like.

Optionally, a part of the driving device layer 102 located in the second display region E2 may have a nearly same relative reflectivity as a part of the driving device layer 102 located in the transition display region E3, and a difference between a relative reflectivity of the part of the driving device layer 102 located in the second display region E2 and a relative reflectivity of the part of the driving device layer 102 located in the transition display region E3 may be less than 5%, so that there is a relative small appearance difference between the transition display region E3 and the second display region E2 of the display panel 100 when the screen is switched off, thereby improving the viewing effect of the display panel 100 when the screen is switched off.

As an optional embodiment, the part of the driving device layer 102 located in the second display region E2 may have a same relative reflectivity as the part of the driving device layer 102 located in the transition display region E3, so that the appearance difference between the transition display region E3 and the second display region E2 of the display panel 100 can be further reduced or eliminated when the screen is switched off.

Optionally, a part of the light-emitting device layer 103 located in the second display region E2 may have a nearly same relative reflectivity as a part of the light-emitting device layer 103 located in the transition display region E3, and a difference between a relative reflectivity of the part of the light-emitting device layer 103 located in the second display region E2 and a relative reflectivity of the part of the light-emitting device layer 103 located in the transition display region E3 may be less than 5%, so that the transition display region E3 and the second display region E2 of the display panel 100 have a same appearance when the screen is switched off, thereby improving the viewing effect of the display panel 100 when the screen is switched off.

As an optional embodiment, the part of the light-emitting device layer 103 located in the second display region E2 may have a same relative reflectivity as the part of the light-emitting device layer 103 located in the transition display region E3, so that the appearance difference between the transition display region E3 and the second display region E2 of the display panel 100 can be further reduced or eliminated when the screen is switched off.

In the display panel 100 according to the embodiments of the present application, the transition display region E3 becomes a part of the second display region E2 when the screen is switched off, and the transition display region E3 becomes a part of the first display region E1 when the screen displays, so that arrangement requirements of the first pixel circuits 160 can be satisfied and the sense of presence of the transition display region E3 can be reduced.

In some optional embodiments, the light-emitting device layer 103 may include a pixel definition layer including a first pixel opening K1 located in the first display region E1, a second pixel opening located in the second display region E2, and a third pixel opening K3 located in the transition display region E3.

The first light-emitting sub-pixel 110 may include a first light-emitting structure 111, a first electrode 112, and a second electrode 113. The first light-emitting structure 111 is located in the first pixel opening K1, the first electrode 112 is located at a side of the first light-emitting structure 111 facing the substrate 101, and the second electrode 113 is located at a side of the first light-emitting structure 111 away from the substrate 101. One of the first electrode 112 and the second electrode 113 is an anode, and the other is a cathode.

The second sub-pixel 130 may include a second light-emitting structure, a third electrode, and a fourth electrode. The second light-emitting structure is located in the second pixel opening, the third electrode is located at a side of the second light-emitting structure facing the substrate 101, and the fourth electrode is located at a side of the second light-emitting structure away from the substrate 101. One of the third electrode and the fourth electrode is an anode, and the other is a cathode.

The third light-emitting sub-pixel 140 may include a third light-emitting structure 141, a fifth electrode 142, and a sixth electrode 143. The third light-emitting structure 141 is located in the third pixel opening K3, the fifth electrode 142 is located at a side of the third light-emitting structure 141 facing the substrate 101, and the sixth electrode 143 is located at a side of the third light-emitting structure 141 away from the substrate 101. One of the fifth electrode 142 and the sixth electrode 143 is an anode, and the other is a cathode.

In the embodiment, an example is given in which the first electrode 112, the third electrode, and the fifth electrode 142 are illustrated as anodes, and the second electrode 113, the fourth electrode, and the sixth electrode 143 are illustrated as cathodes.

Each of the first light-emitting structure 111, the second light-emitting structure, and the third light-emitting structure 141 may include an OLED light-emitting layer, and according to designing requirements, each of the first light-emitting structure 111, the second light-emitting structure, and the third light-emitting structure 141 may further include at least one of a hole injection layer, a hole transport layer, an electron injection layer, or an electron transport layer.

In some optional embodiments, the first electrode 112 is a light-transmitting electrode. In some embodiments, the first electrode 112 includes an indium tin oxide (ITO) layer or an indium zinc oxide layer. In some embodiments, the first electrode 112 is a reflective electrode including a first light-transmitting conductive layer, a reflective layer on the first light-transmitting conductive layer, and a second light-transmitting conductive layer on the reflective layer. The first light-transmitting conductive layer and the second light-transmitting conductive layer may be ITO, indium zinc oxide, and the like, and the reflective layer may be a metal layer, for example, made of a silver material. Each of the third electrode and the fifth electrode 142 may be made of a same material as the first electrode 112.

In some optional embodiments, the second electrode 113 includes a magnesium-silver alloy layer. Each of the fourth electrode and the sixth electrode 143 may be made of a same material as the second electrode 113. In some embodiments, the second electrode 113, the fourth electrode, and the sixth electrode 143 may be interconnected as a common electrode.

In some optional embodiments, an orthographic projection of each first light-emitting structure 111 on the substrate 101 is composed of one first pattern unit or composed of two or more first pattern units joined together, and the first pattern unit includes at least one pattern selected from a group including a circle, an oval, a dumbbell, a gourd and a rectangle.

In some optional embodiments, an orthographic projection of each first electrode 112 on the substrate 101 is composed of one second pattern unit or composed of two or more second pattern units joined together, and the second pattern unit includes at least one pattern selected from a group including a circle, an oval, a dumbbell, a gourd and a rectangle.

In some optional embodiments, an orthographic projection of each third light-emitting structure 141 on the substrate 101 is composed of one third pattern unit or composed of two or more third pattern units joined together, and the third pattern unit includes at least one pattern selected from a group including a circle, an oval, a dumbbell, a gourd and a rectangle.

In some optional embodiments, an orthographic projection of each fifth electrode 142 on the substrate 101 is composed of one fourth pattern unit or composed of two or more fourth pattern units joined together, and the fourth pattern unit includes at least one pattern selected from a group consisting of a circle, an oval, a dumbbell, a gourd and a rectangle.

In some optional embodiments, first electrodes 112 of every first predetermined number of first light-emitting sub-pixels 110 are electrically connected to each other by a first interconnection structure 190, so that the interconnected first light-emitting sub-pixels 110 of the first electrodes 112 form a pixel incorporation structure and may be electrically connected to a same first pixel circuit 160, and therefore a first predetermined number of first light-emitting sub-pixels 110 are driven by one first pixel circuit 160 to display, the actual pixel density of the first display region E1 is further reduced, and driving wires in the first display region E1 are reduced, thereby improving the light transmittance of the first display region E1.

In some embodiments, the above first predetermined number is from 2 to 8, for example, the above first predetermined number is 4, that is, the first electrodes 112 of every 4 first light-emitting sub-pixels 110 are electrically connected to each other by the first interconnection structure 190. In some embodiments, the first interconnection structure 190 and the first electrodes 112 are arranged in a same layer. In other embodiments, the first interconnection structure 190 may further be located in the driving device layer 102 and be electrically connected to the first electrode 112 by a via. The first interconnection structure 190 may be made of a same material as the first electrode 112, or may be made of other conductive materials. Preferentially, the first interconnection structure 190 is a light-transmitting conductive structure, for example, the first interconnection structure 190 is a light-transmitting conductive structure made of ITO.

In other embodiments, fifth electrodes 142 of every second predetermined number of third light-emitting sub-pixels 140 are electrically connected to each other by a second interconnection structure. The second predetermined number is from 2 to 8, for example, the second predetermined number is 4. In some embodiments, the second interconnection structure and the fifth electrodes 142 are arranged in a same layer. In some embodiments, the second interconnection structure is located in the driving device layer 102 and is electrically connected to the fifth electrode 142 by a via. The second interconnection structure may be made of a same material as the fifth electrode 142, or may be made of other conductive materials. Preferentially, the second interconnection structure is a light-transmitting conductive structure.

In addition, the embodiments of the present application further provide a display apparatus including the display panel 100 according to any of the above embodiments. An example of a display apparatus according to an embodiment is given below, in the embodiment, the display apparatus includes the display panel 100 according to the above embodiments.

Figure 8:
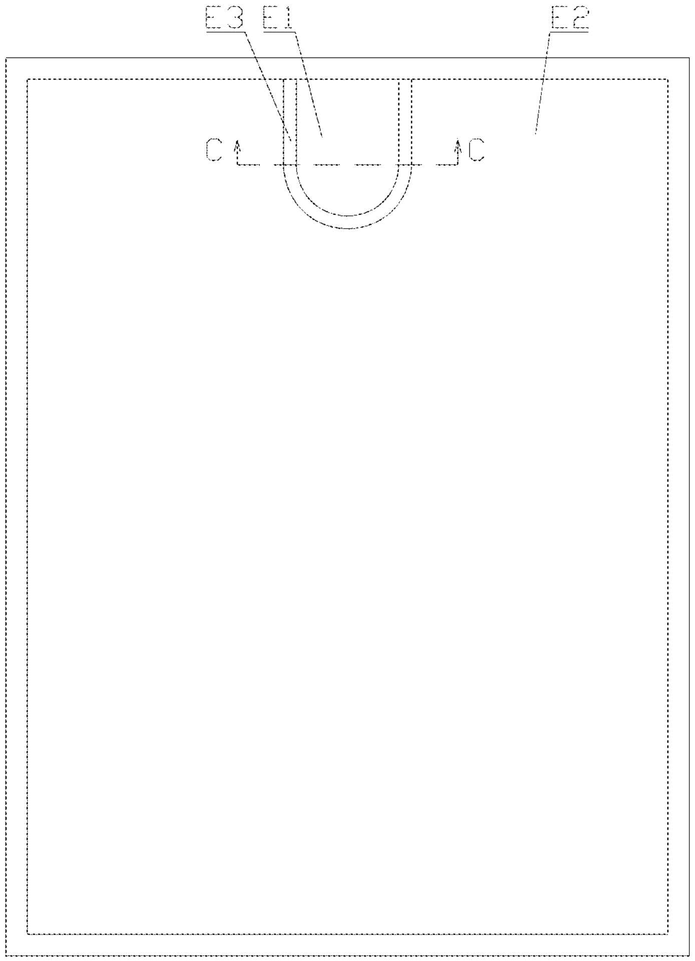
FIG. 8 shows a schematic top view of a display apparatus according to an embodiment of the present application.
Figure 9:
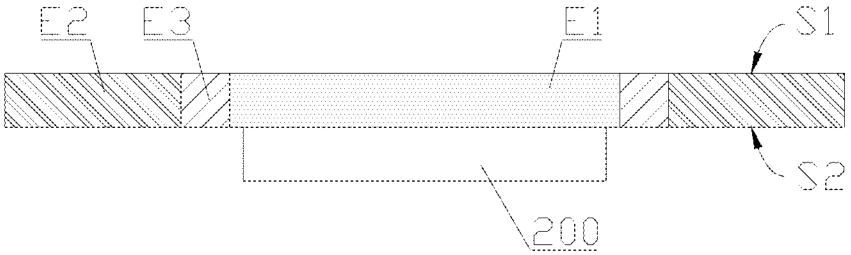
FIG. 9 shows a cross-sectional view along C-C in FIG. 8.

FIG. 8 shows a schematic top view of a display apparatus according to an embodiment of the present application, FIG. 9 shows a cross-sectional view along C-C in FIG. 8. As shown in FIG. 8 and FIG. 9, in the display apparatus according to the embodiment, the display panel 100 may be the display panel 100 according to one of the above embodiments, the display panel 100 has the first display region E1, the second display region E2, and the transition display region E3 between the first display region E1 and the second display region E2, and the light transmittance of the first display region E1 is greater than the light transmittance of the second display region E2.

The display panel 100 includes opposite first surface S1 and second surface S2, wherein the first surface S1 is a display surface. The display apparatus further includes a photosensitive component located at a side of the second surface S2 of the display panel 100. The photosensitive component corresponds to the first display region E1 in position.

The photosensitive component may be an image capturing apparatus for capturing external image information. In the embodiment, the photosensitive component is a complementary metal oxide semiconductor (CMOS) image capturing apparatus. In some other embodiments, the photosensitive component may also be a charge-coupled device (CCD) image capturing apparatus or other types of image capturing apparatus. The photosensitive component may not be limited to an image capturing apparatus, for example, in some embodiments, the photosensitive component may also be a light sensor such as an infrared sensor, a proximity sensor, an infrared lens, a flood sensing element, an ambient light sensor, and a dot matrix projector. In addition, in the display apparatus, other components may further be integrated on the second surface S2 of the display panel 100, such as earphones, speakers, and the like.

In the display apparatus according to the embodiment of the present application, the light transmittance of the first display region E1 is greater than the light transmittance of the second display region E2, so that a photosensitive component may be integrated on a backside of the first display region E1 of the display panel 100, achieving the under-screen integration of a photosensitive component such as an image capturing apparatus, and meanwhile, the first display region E1 can display an image, so that a display area of the display panel 100 increases, thereby achieving a full-screen design of the display apparatus.

The display panel 100 includes the first pixel group G1 located in the first display region E1, the plurality of second sub-pixels 130 and the plurality of second pixel circuits 170 located in the second display region E2, and the third pixel group G3, the plurality of first pixel circuits 160 and the plurality of third pixel circuits 180 located in the transition display region E3.

The first pixel group G1 includes the first light-emitting sub-pixels 110, the third pixel group G3 includes the third light-emitting sub-pixels 140, and both the first light-emitting sub-pixels 110 and the third light-emitting sub-pixels 140 can emit light and display. The first pixel circuits 160 are electrically connected to the first light-emitting sub-pixels 110 for driving the first light-emitting sub-pixels 110 to display; the second pixel circuits 170 are electrically connected to the second sub-pixels 130 for driving the second sub-pixels 130 to display; the third pixel circuits 180 are electrically connected to the third light-emitting sub-pixels 140 for driving the third light-emitting sub-pixel 140 to display.

In the display panel 100 according to the embodiments of the present application, the first pixel circuits 160 configured for driving the first light-emitting sub-pixels 110 to display are arranged in the transition display region E3, so that a wiring structure in the first display region E1 can be reduced, thereby improving the light transmittance of the first display region E1.

In some optional embodiments, the distribution densities of the first pixel circuits 160 and the third pixel circuits 180 in the transition display region E3 are equal to the distribution density of the second pixel circuits 170 in the second display region E2, so that driving device layers 102 of the transition display region E3 and the second display region E2 have a similar structure, a reflectivity difference between the transition display region E3 and the second display region E2 can be reduced, and the appearance difference between the transition display region E3 and the second display region E2 of the display panel 100 can be further reduced when the screen is switched off, thereby improving the viewing effect of the display panel 100 when the screen is switched off.

Those skilled in the art should understand that, the above embodiments are all illustrative rather than restrictive. Different technical features recited in different embodiments may be combined to achieve beneficial effects. Those skilled in the art should be able to understand and implement other modified embodiments of the disclosed embodiments on the basis of studying the drawings, the description, and claims. In the claims, the term "comprising" does not exclude other means or steps; an article is intended to include one or more articles when it is not modified by a quantifier, and may be used interchangeably with "one or more articles"; the terms "first", "second" are used to denote a name and not to denote any particular order. Any reference signs in the claims should not be construed as limiting the protection scope. The functions of several parts recited in the claims may be implemented by a single hardware or software module. Some technical features are recited in different dependent claims, which does not mean that these technical features cannot be combined to obtain beneficial effects.

What is claimed is:

1. A display panel including a first display region, a second display region and a transition display region located between the first display region and the second display region, wherein a light transmittance of the first display region is greater than a light transmittance of the second display region, and the display panel comprises:

a first pixel group located in the first display region and comprising first light-emitting sub-pixels;

a plurality of second sub-pixels located in the second display region;

a third pixel group located in the transition display region and comprising a plurality of third light-emitting sub-pixels;

a plurality of first pixel circuits located in the transition display region, wherein the first pixel circuits are electrically connected to the first light-emitting sub-pixels for driving the first light-emitting sub-pixels to display;

a plurality of second pixel circuits located in the second display region, wherein the second pixel circuits are electrically connected to the second sub-pixels for driving the second sub-pixels to display;

a plurality of third pixel circuits located in the transition display region, wherein the third pixel circuits are electrically connected to the third light-emitting sub-pixels for driving the third light-emitting sub-pixels to display, wherein distribution densities of the first pixel circuits and the third pixel circuits in the transition display region and a distribution density of the second pixel circuits in the second display region satisfy a relationship in a formula 1, $$\frac{|(P_{10}+P_{30})-P_{20}|}{P_{20}} \leq 5\% \quad \text{formula 1}$$

wherein $P_{10}$ is the distribution density of the first pixel circuits in the transition display region, $P_{30}$ is the distribution density of the third pixel circuits in the transition display region, and $P_{20}$ is the distribution density of the second pixel circuits in the second display region, wherein a circuit arrangement structure jointly formed by the first pixel circuits and the third pixel circuits is same as a circuit arrangement structure formed by the second pixel circuits.

2. The display panel according to claim 1, wherein a sum of the distribution densities of the first pixel circuits and the third pixel circuits in the transition display region is equal to the distribution density of the second pixel circuits in the second display region.

3. The display panel according to claim 1, wherein a circuit structure of the first pixel circuit, a circuit structure of the second pixel circuit and a circuit structure of the third pixel circuit are any one of a 2T1C circuit comprising two transistors and one capacitor, a 7T1C circuit comprising seven transistors and one capacitor, a 7T2C circuit comprising seven transistors and two capacitors or a 9T1C circuit comprising nine transistors and one capacitor.

4. The display panel according to claim 1, wherein the second pixel circuits are distributed in an array and arranged uniformly in the second display region, and the first pixel circuits and the third pixel circuits are distributed in an array and arranged uniformly in the transition display region.

5. The display panel according to claim 1, wherein the third pixel group further comprises third non-light-emitting sub-pixels, and distribution densities of the third light-emitting sub-pixels and the third non-light-emitting sub-pixels in the transition display region and a distribution density of the second sub-pixels in the second display region satisfy a relationship in a formula 2, $$\frac{|(P_{31}+P_{32})-P_{21}|}{P_{21}} \leq 5\% \quad \text{formula 2}$$

wherein $P_{31}$ is the distribution density of the third light-emitting sub-pixels in the transition display region, $P_{32}$ is the distribution density of the third non-light-emitting sub-pixels in the transition display region, and $P_{21}$ is the distribution density of the second sub-pixels in the second display region.

6. The display panel according to claim 5, wherein a sum of the distribution densities of the third light-emitting sub-pixels and the third non-light-emitting sub-pixels in the transition display region is equal to the distribution density of the second sub-pixels in the second display region.

7. The display panel according to claim 5, wherein a pixel arrangement structure jointly formed by the third light-emitting sub-pixels and the third non-light-emitting sub-pixels is same as a pixel arrangement structure formed by the second sub-pixels.

8. The display panel according to claim 7, wherein the third light-emitting sub-pixel and the second sub-pixel of a same color have a nearly same size.

9. The display panel according to claim 1, wherein a distribution density of the third light-emitting sub-pixels in the transition display region and a distribution density of the first light-emitting sub-pixels in the first display region satisfy a relationship in a formula 3, $$\frac{|P_{31}-P_{11}|}{P_{11}} \leq 5\% \quad \text{formula 3}$$

Wherein $P_{31}$ is the distribution density of the third light-emitting sub-pixels in the transition display region, and $P_{11}$ is the distribution density of the first light-emitting sub-pixels in the first display region.

10. The display panel according to claim 9, wherein the distribution density of the first light-emitting sub-pixels in the first display region is less than the distribution density of the second sub-pixels in the second display region.

11. The display panel according to claim 1, wherein a pixel arrangement structure formed by the third light-emitting sub-pixels is same as a pixel arrangement structure formed by the first light-emitting sub-pixels.

12. The display panel according to claim 11, wherein the third light-emitting sub-pixel and the first light-emitting sub-pixel of a same color have a nearly same size.

13. The display panel according to claim 1, wherein the display panel comprises:

a substrate;

a driving device layer located on the substrate, wherein the first pixel circuits, the second pixel circuits and the third pixel circuits are located in the driving device layer; and a light-emitting device layer located at a side of the driver device layer away from the substrate, wherein the first pixel group, the second sub-pixels and the third pixel group are located in the light-emitting device layer, wherein a part of the driving device layer located in the second display region has a nearly same relative reflectivity as a part of the driving device layer located in the transition display region.

14. The display panel according to claim 13, wherein a part of the light-emitting device layer located in the second display region has a nearly same relative reflectivity as a part of the light-emitting device layer located in the transition display region.

15. The display panel according to claim 13, wherein the light-emitting device layer comprises a pixel definition layer comprising a first pixel opening located in the first display region and a third pixel opening located in the transition display region, the first light-emitting sub-pixel comprises a first light-emitting structure, a first electrode and a second electrode, wherein the first light-emitting structure is located in the first pixel opening, the first electrode is located at a side of the first light-emitting structure facing the substrate, and the second electrode is located at a side of the first light-emitting structure away from the substrate;

the third light-emitting sub-pixel comprises a third light-emitting structure, a fifth electrode and a sixth electrode, wherein the third light-emitting structure is located in the third pixel opening, the fifth electrode is located at a side of the third light-emitting structure facing the substrate, and the sixth electrode is located at a side of the third light-emitting structure away from the substrate.

16. The display panel according to claim 15, wherein an orthographic projection of each first light-emitting structure on the substrate is composed of one first pattern unit or composed of two or more first pattern units joined together, and each first pattern unit comprises at least one pattern selected from a group including a circle, an oval, a dumbbell, a gourd and a rectangle; and/or, an orthographic projection of each first electrode on the substrate is composed of one second pattern unit or composed of two or more second pattern units joined together, and the second pattern unit comprises at least one pattern selected from a group including a circle, an ellipse, a dumbbell, a gourd and a rectangle; and/or, an orthographic projection of each third light-emitting structure on the substrate is composed of one third pattern unit or composed of two or more third pattern units joined together, and the third pattern unit comprises at least one pattern selected from a group including a circle, an ellipse, a dumbbell, a gourd and a rectangle; and/or, an orthographic projection of each fifth electrode on the substrate is composed of one fourth pattern unit or composed of two or more fourth pattern units joined together, and the fourth pattern unit comprises at least one pattern selected from a group including a circle, an ellipse, a dumbbell, a gourd and a rectangle.

17. The display panel according to claim 15, wherein the first electrode is a light-transmitting electrode or a reflective electrode, and the second electrode, the fourth electrode and the sixth electrode are interconnected as a common electrode.

18. The display panel according to claim 15, wherein first electrodes of every first predetermined number of the first light-emitting sub-pixels are electrically connected to each other by a first interconnection structure; and/or, fifth electrodes of every second predetermined number of the third light-emitting sub-pixels are electrically connected to each other by a second interconnection structure.

19. The display panel according to claim 18, wherein the first predetermined number is from 2 to 8; and/or, the first interconnection structure and the first electrodes are arranged in a same layer; and/or, the first interconnection structure is located in the driving device layer and is electrically connected to the first electrode by a via; and/or the first interconnection structure is a light-transmitting conductive structure; and/or, the second predetermined number is from 2 to 8; and/or, the second interconnection structure and the fifth electrodes are arranged in a same layer; and/or, the second interconnection structure is located in the driving device layer and is electrically connected to the fifth electrode by a via; and/or, the second interconnection structure is a light-transmitting conductive structure.

* * * * *